(12) United States Patent
Clifton

(10) Patent No.: US 8,361,867 B2
(45) Date of Patent: Jan. 29, 2013

(54) BIAXIAL STRAINED FIELD EFFECT TRANSISTOR DEVICES

(75) Inventor: Paul A. Clifton, Mountain View, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 40 days.

(21) Appl. No.: 12/727,476

(22) Filed: Mar. 19, 2010

(65) Prior Publication Data

US 2011/0230026 A1 Sep. 22, 2011

(51) Int. Cl.
*H01L 21/336* (2006.01)

(52) U.S. Cl. ............... 438/285; 438/752; 257/E21.375; 257/E21.103

(58) Field of Classification Search ............ 216/39, 216/79, 99; 438/752, 285; 257/E21.103, 257/E21.546, E21.375
See application file for complete search history.

(56) References Cited

U.S. PATENT DOCUMENTS

| | | | |
|---|---|---|---|
| 4,877,749 A | 10/1989 | Quigg | |
| 4,994,866 A | 2/1991 | Awano | |
| 5,155,571 A | 10/1992 | Wang et al. | |
| 5,698,869 A * | 12/1997 | Yoshimi et al. | 257/192 |
| 6,406,973 B1 | 6/2002 | Lee | |
| 6,492,216 B1 | 12/2002 | Yeo et al. | |
| 6,498,359 B2 | 12/2002 | Schmidt et al. | |
| 6,600,170 B1 | 7/2003 | Xiang | |
| 6,707,106 B1 | 3/2004 | Wristers et al. | |
| 6,881,635 B1 | 4/2005 | Chidambarrao et al. | |
| 6,927,138 B2 | 8/2005 | Takenaka | |
| 7,019,326 B2 | 3/2006 | Cea et al. | |
| 7,138,310 B2 | 11/2006 | Currie et al. | |
| 7,202,513 B1 | 4/2007 | Chidambarrao et al. | |
| 7,338,834 B2 | 3/2008 | Clifton | |
| 2001/0048119 A1 | 12/2001 | Mizuno et al. | |
| 2004/0021179 A1 | 2/2004 | Lee et al. | |
| 2004/0152297 A1 * | 8/2004 | Ooto et al. | 438/629 |
| 2004/0256639 A1 * | 12/2004 | Ouyang et al. | 257/202 |

(Continued)

FOREIGN PATENT DOCUMENTS

| EP | 1 231 643 A2 | 8/2002 |
|---|---|---|
| EP | 1 231 643 A3 | 10/2004 |

OTHER PUBLICATIONS

International Search Report/Written Opinion for PCT/US2007/006171, Sep. 28, 2007.

(Continued)

*Primary Examiner* — Caridad Everhart
(74) *Attorney, Agent, or Firm* — Orrick Herrington & Sutcliffe LLP

(57) ABSTRACT

A process for forming contacts to a field effect transistor provides edge relaxation of a buried stressor layer, inducing strain in an initially relaxed surface semiconductor layer above the buried stressor layer. A process can start with a silicon or silicon-on-insulator substrate with a buried silicon germanium layer having an appropriate thickness and germanium concentration. Other stressor materials can be used. Trenches are etched through a pre-metal dielectric to the contacts of the FET. Etching extends further into the substrate, through the surface silicon layer, through the silicon germanium layer and into the substrate below the silicon germanium layer. The further etch is performed to a depth to allow for sufficient edge relaxation to induce a desired level of longitudinal strain to the surface layer of the FET. Subsequent processing forms contacts extending through the pre-metal dielectric and at least partially into the trenches within the substrate.

15 Claims, 5 Drawing Sheets

U.S. PATENT DOCUMENTS

| | | | |
|---|---|---|---|
| 2005/0093021 | A1 | 5/2005 | Ouyang et al. |
| 2005/0104131 | A1 | 5/2005 | Chidambarrao et al. |
| 2005/0106792 | A1 | 5/2005 | Cea et al. |
| 2005/0133817 | A1 | 6/2005 | Huang et al. |
| 2005/0158931 | A1* | 7/2005 | Chen et al. .............. 438/191 |
| 2005/0255667 | A1 | 11/2005 | Arghavani et al. |
| 2006/0038199 | A1 | 2/2006 | Lee |
| 2006/0081837 | A1 | 4/2006 | Bedell et al. |
| 2007/0202651 | A1* | 8/2007 | Zhang et al. ............. 438/296 |
| 2008/0116517 | A1 | 5/2008 | Anderson |
| 2008/0124858 | A1 | 5/2008 | Nguyen et al. |
| 2008/0135873 | A1* | 6/2008 | Fiorenza et al. ............ 257/190 |
| 2008/0179636 | A1 | 7/2008 | Chidambarrao et al. |
| 2008/0242097 | A1 | 10/2008 | Boescke et al. |
| 2009/0104746 | A1 | 4/2009 | Clifton et al. |
| 2009/0166866 | A1 | 7/2009 | Fastow et al. |
| 2009/0194821 | A1 | 8/2009 | Kaneko et al. |
| 2009/0221115 | A1 | 9/2009 | Scott et al. |
| 2010/0090289 | A1 | 4/2010 | Yang et al. |

OTHER PUBLICATIONS

S.C. Jain, H.E. Maes, K. Pinardi and I. DeWolf, "Stresses and Strains in Lattice-Mismatched Stripes, Quantum Wires, Quantum Dots, and Substrates in Si Technology," American Institute of Physics. 79 (11), Jun. 1, 1996.

H. Yin, K.D. Hobart, F.J. Kub, S.R. Shieh, T.S. Duffy, J.C. Sturm, "Strain Partition of Si/SiGe and SiO$_2$/SiGe on Compliant Substrates," American Institute of Plysics, Appl. Phys., Jun. 2, 2003.

A. Fisher and H. Richter, "Elastic Misfit Stress Relaxation in Heteroepitaxial SiGe/Si Mesa Structures," 1992 American Institute of Plysics, Appl. Phys. Lett 61(22), Nov. 30, 1992.

Hirohisa Kawasaki, et al., "Impact of Parasitic Resistance and Silicon Layer Thickness Scaling for Strained-Silicon MOSFETs on Relaxed Si$_{1-x}$Ge$_x$ Virtual Substrate,", 2004 IEEE.

C. H. Jan, et al., "A 45nm Low Power System-On-Chip Technology with Dual Gate (Logic and I/O) High-k/Metal Gate Strained Silicon Transistors," IEE Explore, Dec. 15-17, 2008.

R. Watanabe, et al., "A Low Power 40nm CMOS Technology Featuring Extremely High Density of Logic (2100kGate/mm$^2$) and SRAM (0.195μm$^2$) for Wide Range of Mobile Applications with Wireless System," System LSI Division, Semiconductor Company, IEE Explore, Dec. 15-17, 2008.

S. Chung, et al., "More Strain and Less Stress—The Guideline for Developing High-End Strained CMOS Technologies with Acceptable Reliability," IEEE, Dec. 15-17, 2008.

Haizhou Yin, et al., "Uniaxial Strain Relaxation on Ultra-thin Strained-Si Directly on Insulator (SSDOI) Substrates," IEEE, Oct. 2006.

Yin et al., "Uniaxial Strain Relaxation on Ultra-thin Strained-Si Directly on Insulator (SSDOI) Substrates," International Conference on Solid-State and Integrated Circuit Technology Proceedings, Oct. 2006, pp. 136-138.

PCT International Search Report for corresponding PCT application No. PCT/US2011/028255, dated Sep. 13, 2011.

* cited by examiner

BIAXIAL STRAINED FIELD EFFECT TRANSISTOR DEVICES

BACKGROUND

1. Field of the Invention

The present invention relates to strained semiconductor devices that incorporate strained active layers and methods for making such devices. The invention more specifically relates to methods of making strained semiconductor devices in which biaxial strain can be provided to the active regions of small geometry devices.

2. Description of the Related Art

Strained silicon is widely viewed as an important technology for obtaining desired advancements in integrated circuit performance. Mobility enhancement results from a combination of reduced effective carrier mass and reduced intervalley (phonon) scattering. For MOS field effect transistors (MOSFETs) fabricated on conventional {100} oriented silicon substrates with conduction primarily along <110> crystal axes, n-channel MOSFETs achieve improved performance with induced biaxial tensile strain in the top silicon layer along both the width and length axes of the active area. p-channel MOSFETs exhibit improved performance with induced uniaxial tensile strain in the top silicon layer along the width axis only (transverse tensile strain), p-channel MOSFETs also exhibit improved performance with induced uniaxial compressive strain in the top silicon layer along the length axis only (longitudinal compressive strain). Compressive strain can be provided selectively in a silicon surface layer, for example, by using recessed selective epitaxial silicon germanium stressors in the source and drain regions of a MOSFET to induce a desired uniaxial compressive strain along the length axis (longitudinal).

Strained silicon is conventionally obtained by first growing a thick layer of silicon germanium alloy (SiGe) on a silicon substrate. The silicon germanium layer is caused to be relaxed to an unstrained condition at its surface either by deliberately growing the layer to a thickness exceeding its critical thickness or otherwise inducing misfit dislocations, for example by implantation of ions. The in-plane lattice parameter of the silicon germanium surface is similar to that of a bulk crystal of silicon germanium of the same composition. Silicon germanium alloys have larger lattice parameters than silicon. Hence the relaxed surface of the silicon germanium layer provides an in-plane lattice parameter larger than that of silicon. A subsequent thin layer of silicon is grown epitaxially on the relaxed surface of the silicon germanium layer. The thin epitaxial layer of silicon assumes the larger in-plane lattice parameter of the silicon germanium and grows in a strained state with bonds in the crystal lattice elongated in the growth plane. This approach, sometimes known as substrate-strained silicon or "virtual substrate" technology, grows a thin pseudomorphic layer of silicon on the relaxed surface of a silicon germanium layer.

So long as the strained silicon layer does not exceed a "critical thickness" for strain relaxation and some care is taken, the tensile strain is maintained in the strained silicon layer throughout the various implantation and thermal processing steps typical of CMOS manufacturing.

The use of a relaxed silicon germanium layer as a "virtual substrate" to strain a subsequently deposited epitaxial silicon layer inevitably requires acceptance of a very high dislocation density in the silicon germanium layer because the silicon germanium relaxation mechanism is plastic in nature. In other words, relaxation in the silicon germanium layer occurs through the generation of strain-relieving misfit dislocations. A silicon germanium layer thinner than the critical thickness on a silicon substrate is not relaxed and exhibits few misfit dislocations. If the silicon germanium layer is thicker than the critical thickness, the strained lattice undergoes plastic deformation and the stress is relieved to some degree by the nucleation and propagation of misfit dislocations. Some fraction of misfit dislocations gives rise to threading dislocations (at least $10^4$-$10^5$ cm$^{-2}$) which propagate through the overlying strained silicon layer. Threading dislocations represent extended defects and give rise to multiple undesirable consequences in MOSFETs including source/drain junction leakage, reduction of channel mobility, variability of threshold voltage and enhanced diffusion paths leading to potential drain-to-source shorting in short-channel MOSFETs.

Contemporary FET and contact manufacturing strategies are illustrated in Jan, et al., "A 45 nm Low Power System-On-Chip Technology with Dual Gate (Logic and I/O) High-k/Metal Gate Strained Silicon Transistors," International Electron Devices Meeting (IEDM) 2008, and in Watanabe, et al., "A Low Power 40 nm CMOS Technology Featuring Extremely High Density of Logic (2100 kGate/mm$^2$) and SRAM (0.195 µm$^2$) for Wide Range of Mobile Applications with Wireless System," International Electron Devices Meeting (IEDM) 2008. These papers each describe high-density, low-power devices that can be used in system-on-chip applications such as are commonly used in wireless systems.

SUMMARY OF THE PREFERRED EMBODIMENTS

Aspects of the present invention provide a method of manufacturing a semiconductor device comprising providing a substrate having a semiconductor surface layer. A substrate has a semiconductor surface layer and a stressor layer positioned at a depth within the substrate and positioned adjacent the semiconductor surface layer. The buried stressor layer is in a stressed state in comparison to the semiconductor surface layer. A field effect transistor is formed on the semiconductor surface layer, with the field effect transistor comprising source and drain regions and a gate structure. A pre-metal dielectric layer is deposited over the field effect transistor. Openings are etched through the pre-metal dielectric layer to expose contact portions of the substrate on either side of the gate structure corresponding to portions of the source and drain of the field effect transistor. The method continues by etching into the substrate within the openings in the pre-metal dielectric, the etching proceeding to sufficient depth so that the stressor layer induces stress in the semiconductor surface layer to provide longitudinal stress to the upper semiconductor layer in an active region of the field effect transistor through edge relaxation. Electrical contacts are formed to the source and drain regions with the contacts formed at least partially within the substrate.

Other aspects of the present invention provide a method of manufacturing a semiconductor device comprising providing a substrate having a semiconductor surface layer. A field effect transistor is on the semiconductor surface layer. The field effect transistor comprises source and drain regions and a gate structure. A pre-metal dielectric layer is formed over the field effect transistor. The method proceeds by etching openings in the pre-metal dielectric layer and etching to expose contact portions of the substrate on either side of the gate structure. Using an orientation-selective wet etch, the substrate is etched within the openings in the pre-metal dielectric. Contacts are formed to the source and drain regions with the contacts formed at least partially within the substrate.

Another aspect of the present invention provides a method of manufacturing a semiconductor device including providing a substrate having a region defined on at least two sides by trenches, the trenches separated by a first lateral extent and selectively depositing a stressor layer and a semiconductor surface layer, the semiconductor surface layer grown in a stressed state across the first lateral extent of the semiconductor surface layer. The method forms a field effect transistor on the semiconductor surface layer. The field effect transistor comprises source and drain regions and a gate structure and is positioned so that an active region of the field effect transistor is in the stressed semiconductor surface layer.

DETAILED DESCRIPTION OF THE PREFERRED EMBODIMENTS

Figure 1:
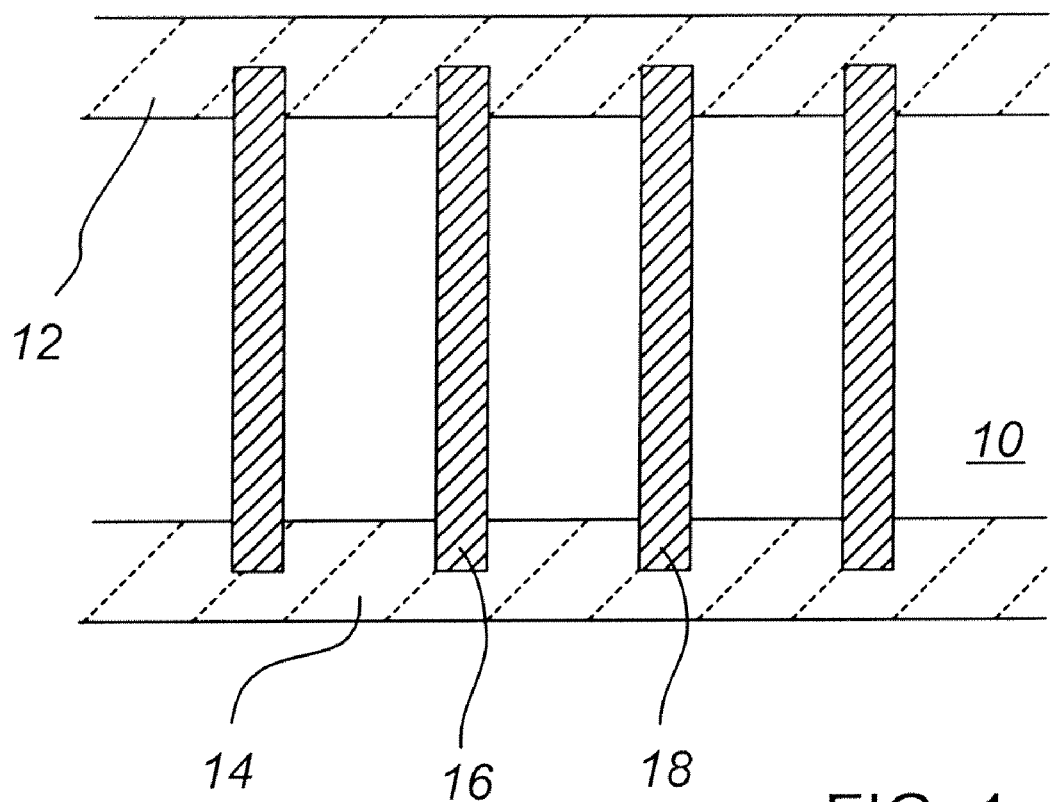
FIG. 1 illustrates in schematic plan view a configuration of field effect transistors and trench isolation structures that can benefit from certain aspects of preferred embodiments of the present invention.

Preferred embodiments of the present invention provide longitudinal strain to the top semiconductor layer in the active region of a field effect transistor (FET) by forming contacts to the FET in a way that allows a buried stressor layer to induce strain in an active semiconductor layer of the FET through edge relaxation along the longitudinal direction. Here longitudinal means in the same direction as current flows between the source and drain. Particularly preferred embodiments use a silicon or silicon-on-oxide substrate with a buried silicon germanium layer having an appropriate thickness and germanium concentration. Typically, contacts to FETs are formed by etching through a pre-metal dielectric (PMD), sometimes alternatively referred to as zero level inter-layer dielectric (ILD0), as part of providing contacts to source or drain regions of FETs. In preferred embodiments according to the present invention, a further etch is performed into the substrate within the opening in the dielectric to the substrate created by the pre-metal dielectric contact etch. The further etch extends into the substrate through the surface silicon layer and preferably through the silicon germanium layer and into the substrate below the silicon germanium layer. The further etch is performed to a sufficient depth to allow for a desired amount of edge relaxation, as that term is explained in U.S. Pat. No. 7,338,834, to induce a desired amount of longitudinal stress to the active layer of at least one FET. Subsequent processing forms contacts extending through the pre-metal dielectric and at least partially into the trench within the substrate.

U.S. Pat. No. 7,338,834, "Strained Silicon with Elastic Edge Relaxation," describes a strategy for effectively forming a strained silicon active layer by providing a sub-critical-thickness silicon germanium layer buried below an active layer of silicon. For present purposes, the term "critical thickness" is intended to denote the thickness above which a density of dislocations arises due to plastic relaxation sufficient to have a significant impact on the yield of integrated circuits manufactured using a substrate containing the stressor layer and the term "sub-critical-thickness" denotes a thickness of a strained layer sufficiently small for there to be a sufficiently low density of dislocations present in a finished integrated circuit product that the yield of such a product is not significantly reduced. The buried silicon germanium layer is stressed in its as-formed state and the active layer is unstrained in its as-formed state. The buried silicon germanium stressor layer induces strain in the silicon active layer, for example, in the process of forming trench isolation structures. In particular, trenches are etched through the silicon active layer, through the silicon germanium stressor layer and preferably into the substrate. Redistribution of stress from the buried stressor layer to the top semiconductor layer is accomplished by edge relaxation, as described in U.S. Pat. No. 7,338,834, which is incorporated by reference here for all purposes. By spacing the trenches appropriately around the entirety of the surface layer of a device, biaxial stress can be introduced to the top semiconductor layer of the device.

Watanabe, et al., "A Low Power 40 nm CMOS Technology Featuring Extremely High Density of Logic (2100 kGate/mm$^2$) and SRAM (0.195 μm$^2$) for Wide Range of Mobile Applications with Wireless System," International Electron Devices Meeting (IEDM) 2008 describes forming field effect transistors where no trench isolation structure is formed between adjacent FETs. There are instances where no isolation trench is etched between adjacent FETs and the active region of each FET may be spaced a large distance from a trench parallel to the transverse direction. Consequently, it may be difficult to apply the methods described in U.S. Pat. No. 7,338,834 to induce longitudinal strain in the top semiconductor layer in the active region of at least some FETs in the configurations illustrated in the Watanabe, et al., article. FETs in the configurations illustrated in the Watanabe, et al., article may not have desired properties even if the FET active regions are in thin silicon layers over a silicon germanium stressor layer, for the reasons discussed in U.S. Pat. No. 7,338,834. Such FET configurations are very typical in high density static random access memory (SRAM) cell layouts where a majority of the n-channel FETs in particular typically have active regions uninterrupted by trench isolation along the longitudinal direction.

A preferred implementation of the present invention provides a semiconductor substrate that has a semiconductor stressor layer buried beneath a semiconductor surface layer. Processing provides at least two FETs positioned close to one another with no trench isolation structure formed between the at least two FETs. The gates of the at least two FETs are generally parallel to each other over their respective active regions, but there may be some variations from a generally parallel arrangement, so long as the process here provides longitudinal strain to the top semiconductor layer of one or more of the at least two FETs. Following formation of the at least two FETs, a pre-metal dielectric layer is formed over the transistors and typically is planarized. A contact trench is then opened through the pre-metal dielectric to expose the substrate surface at or adjacent to the source or drain region of the FET.

Processing continues by etching the substrate where it is exposed by the opening in the pre-metal dielectric layer. Conventional etching strategies might be used for etching the substrate, such as plasma etching or reactive ion etching. The pre-metal dielectric layer can act as a mask for this substrate etching process, or the substrate etching process may use a photoresist based mask or hard mask. Etching is performed into the substrate through the surface layer, into and preferably through the stressor layer, and into the substrate below the stressor layer. Preferably the etching into the substrate is done to sufficient depth from the surface layer to allow the buried stressor layer to induce a sufficient amount of strain in the overlying upper semiconductor layer through edge relaxation. As is explained in U.S. Pat. No. 7,338,834, edge relaxation can efficiently transfer stress when the walls of the contact trenches are sufficiently close together to allow for a technologically useful amount of strain to be induced over a substantial proportion of the distance between the edges of the active layer. Stress transfer and edge relaxation may increase for increasing etch depths into the substrate below the stressor layer. On the other hand, stress transfer and edge relaxation can be achieved for smaller etch depths, as well.

In this preferred implementation, a suitable substrate might be a silicon wafer or a silicon-on-insulator (SOI) substrate. Other semiconductors may be used as the substrate in different applications. One example of a suitable stressor layer for this implementation is silicon germanium, formed to less than its critical thickness. Another example might be silicon nitride deposited in an appropriately stressed state, which might be tensile or compressive for different applications. There are various ways known in the art for forming a semiconductor substrate with a buried stressor layer. Regardless of the type of stressor layer and how it is formed, particularly preferred embodiments of the present invention provide a silicon surface layer that is formed into an active region for a device such as a FET. For a silicon surface layer, an active region having biaxial tensile strain is most advantageous for n-type FETs and the preferred stressor layer is one that has compressive stress as formed within the buried stressor substrate, which is the case for the preferred silicon germanium layer. Appropriate germanium concentration levels may be, for example, on the order of 10% to 100% and the thickness of such a compressively stressed silicon germanium layer is desirably close to, but less than, the critical thickness for such a layer. Critical thicknesses vary according to composition and can be estimated for various concentrations of germanium within silicon germanium on a silicon substrate according to accepted theoretical formulae but for present usage, as previously described, "critical thickness" is considered for practical purposes to be the limiting thickness for yield impairment, that is, the thickness of the stressor layer above which significant yield reduction is observed for manufactured integrated circuits.

After forming the trench from the contact opening into the substrate to a desired depth, further processing is performed to form a metal contact to the source or drain region of at least one of the FETs. In some configurations, one contact may be made in common to the source or drain regions of adjacent FETs. For either a contact to a single FET or a common contact to two adjacent FETs, it may be advantageous to have the metallic portion of the contact extend at least partially into the substrate because this increases the surface area between the metal and the doped source or drain region, improving the effective area of the contact and preferably reducing the resistance of the contact. Aspects of the present invention provide improved contact area to source or drain regions of FETs and these aspects of the invention have utility independent of the active layer stress aspects of the invention.

On the other hand, there may be advantages to not having the contact metal extend to the bottom of the trench etched in the substrate. An example of such an implementation when it is not advantageous to have the contact metal extend to the bottom of the trench is when the buried silicon germanium layer is doped so that it can function as a virtual ground plane.

This disclosure incorporates by reference the text and teachings of U.S. Pat. No. 7,338,834, entitled "Strained Silicon with Elastic Edge Relaxation," in its entirety. U.S. Pat. No. 7,338,834 discusses elastic edge relaxation and its use in effectively creating strained silicon regions and the patent is specifically incorporated in its entirety for its teachings with respect to stress relaxation and forming strained regions of a material.

In many preferred embodiments, isolation trenches are used to partially isolate individual FETs or groups of FETs. These isolation trenches preferably are positioned with respect to portions of a FET or group of FETs to facilitate or cause edge relaxation and to allow a buried stressor layer to in part induce stress in an overlying active layer. This induced strain operation is as described in U.S. Pat. No. 7,338,834. In some of the preferred implementations described here, isolation trenches may only be near portions of the active region of each FET and so the isolation trenches might provide edge relaxation only to the portions of the FETs that are close to the isolation trenches. FIG. 1 schematically illustrates a layout in which a substrate 10 is provided with isolation trenches 12, 14 that isolate a set of transistors arranged along a strip of silicon of the substrate 10. As illustrated in plan view in FIG. 1, the gates 16, 18 of the array of transistors are provided sufficiently close to preclude forming isolation trenches between adjacent gates along the strip. In alternate implementations, the configuration illustrated in FIG. 1 may be selected to facilitate formation of common contacts, even in situations where process considerations would allow formation of isolation trenches between gates along the strip. Because of the arrangement of the FETs along the strip that does not form isolation trenches between adjacent FETs, trenches are not readily used to transfer longitudinal stress from an underlying stressor layer to an upper overlying semiconductor layer.

Figure 2:
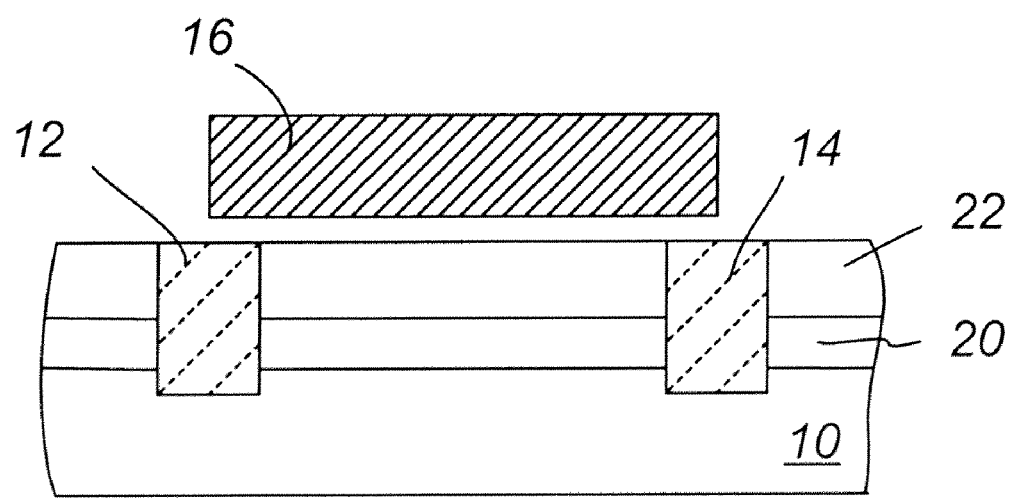
FIG. 2 schematically illustrates a cross sectional view through one of the field effect transistor gates in the configuration of FIG. 1.

FIG. 2 illustrates a cross section through the strip of FIG. 1 and specifically through gate 16. As illustrated, the substrate 10 has a buried stressor layer 20 that is preferably a silicon germanium layer as described in U.S. Pat. No. 7,338,834. Alternately, the buried stressor layer may be compressive or tensile stressed silicon nitride or another appropriate stressor material. The substrate 10, for example, preferably may be a silicon substrate or a silicon-on-insulator substrate or other substrate. As discussed in the patent, preferred silicon germanium stressor layer 20 is formed in a compressively stressed state. The buried silicon germanium stressor layer 20 induces strain in the upper silicon layer 22 when the isolation trenches associated with isolation structures 12, 14 are etched through the upper silicon layer 22 and the buried stressor layer 20. In preferred implementations, the illustrated trenches are sufficiently close together to allow for edge relaxation and induced strain across the entire lateral extent of the upper silicon layer 22. On the other hand, the contact edge relaxation strategies described below are advantageously applied whether or not the upper silicon layer is stressed across the width illustrated in FIG. 2.

Figure 3:
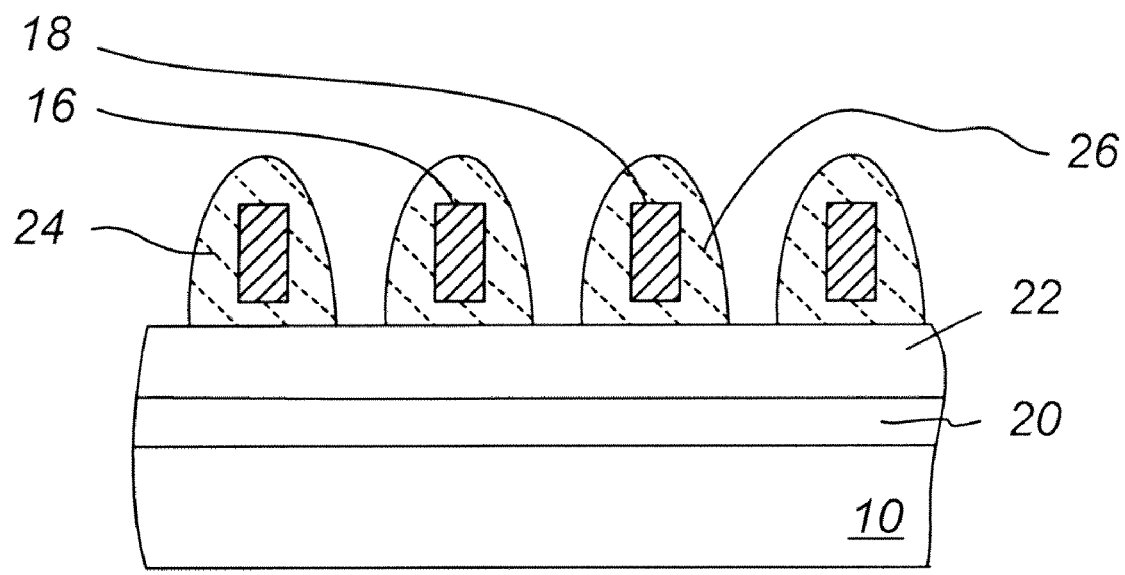
FIGS. 3-7 illustrate processes according to aspects of the present invention for forming a longitudinal strained silicon surface region that may be provided in a configuration like that illustrated in FIGS. 1 and 2 or may be provided in another configuration.
Figure 4:
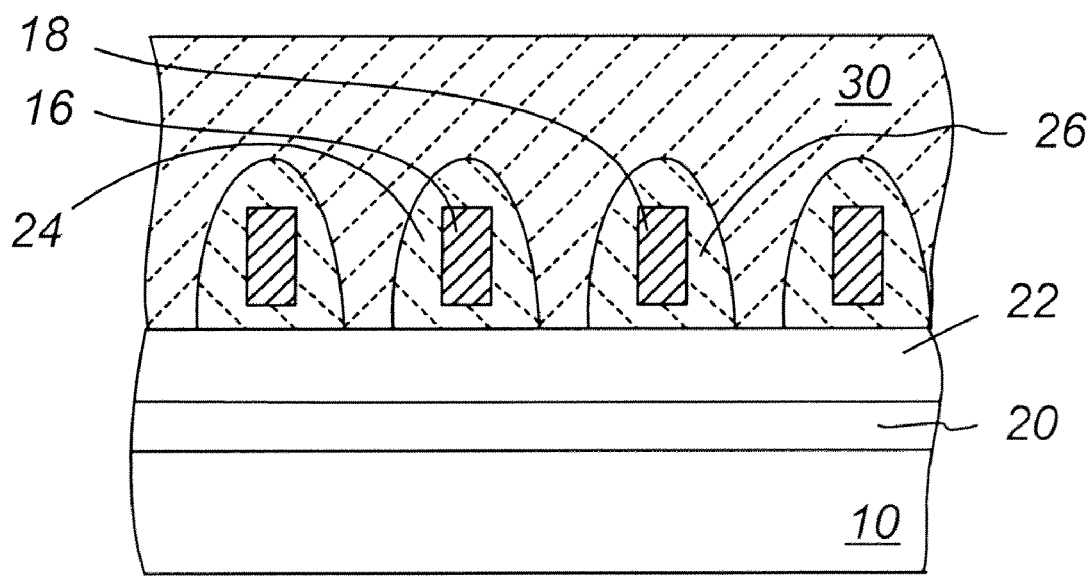

Further conventional processing is performed to form FETs, including forming gate dielectrics, gate electrodes, spacers, source and drain regions (not shown) or contact regions (not shown). One FET including a gate electrode 16 is illustrated highly schematically in FIG. 2. Preferably the upper silicon layer 22 is stressed under the entire transverse lateral extent of the gate electrode 16 to provide transverse stress in those instances where it is desired. FIG. 3 illustrates schematically four transistors in cross section, with gate electrodes 16, 18 shown, as well as spacer and gate insulating structures 24, 26. In the cross section shown in FIG. 3, the upper silicon layer 22 is not stressed in the longitudinal direction (which is in plane in the illustration) because edge relaxation has not occurred in the longitudinal direction. FIG. 4 shows a further stage in the processing of the FIG. 3 array of FETs, with a zero level interlevel dielectric or pre-metal dielectric 30 deposited over the array of FETs. The pre-metal dielectric 30 typically is planarized, for example using chemical mechanical polishing to provide the intermediate integrated circuit structure illustrated in FIG. 4. It should be appreciated that in FIG. 4 and the other drawings only a portion of a much larger wafer or workpiece is shown.

Figure 5:
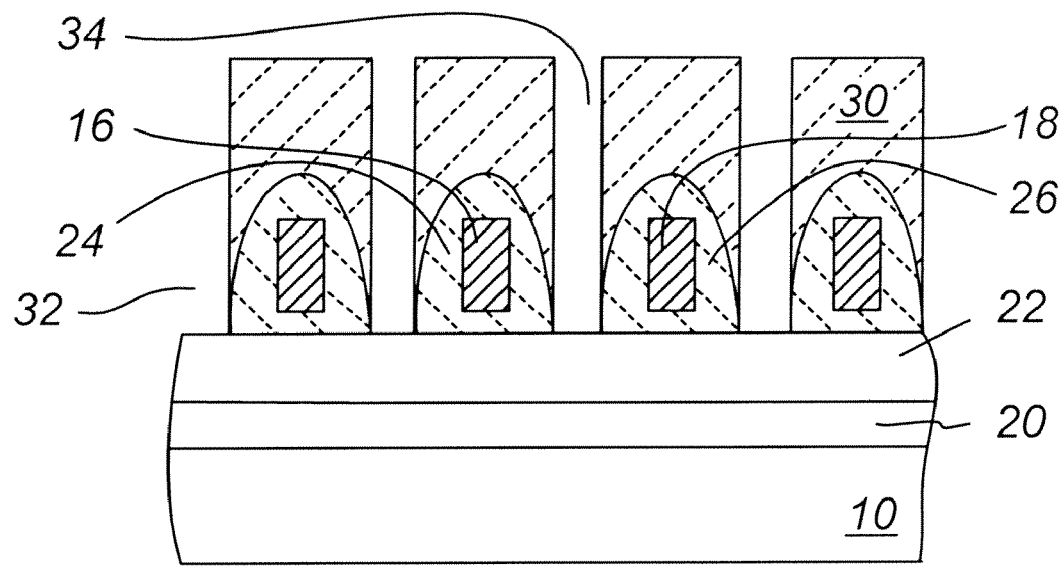

Processing continues as illustrated in FIG. 5 to etch contact trenches 32, 34 through the pre-metal dielectric to the substrate above or adjacent to the source and drain regions associated with the transistors illustrated in FIG. 5. The contact etching process may be performed using conventional photolithography, using photoresist, hard or other mask technology as is well known. Typical dry etch chemistries used with dielectrics will stop at the surface of the substrate, but the step illustrated in FIG. 5 is typically an intermediate processing step and in a preferred embodiment the etching continues into the substrate to form trenches in the substrate.

In general, it is preferred that the contact trenches in this embodiment extend parallel to the gate electrodes to a considerable extent. Preferably, the contact trenches extend all of the distance between the trench isolation structures 12 and 14. The spacing of contact trenches from adjacent gate electrodes will be a function of alignment tolerances and uniformity over a workpiece. Also, while the illustrated embodiment is of an array of FETs, the strategy described here can be used advantageously with an individual FET with contacts made individually to the FET's source and drain regions.

Figure 6:
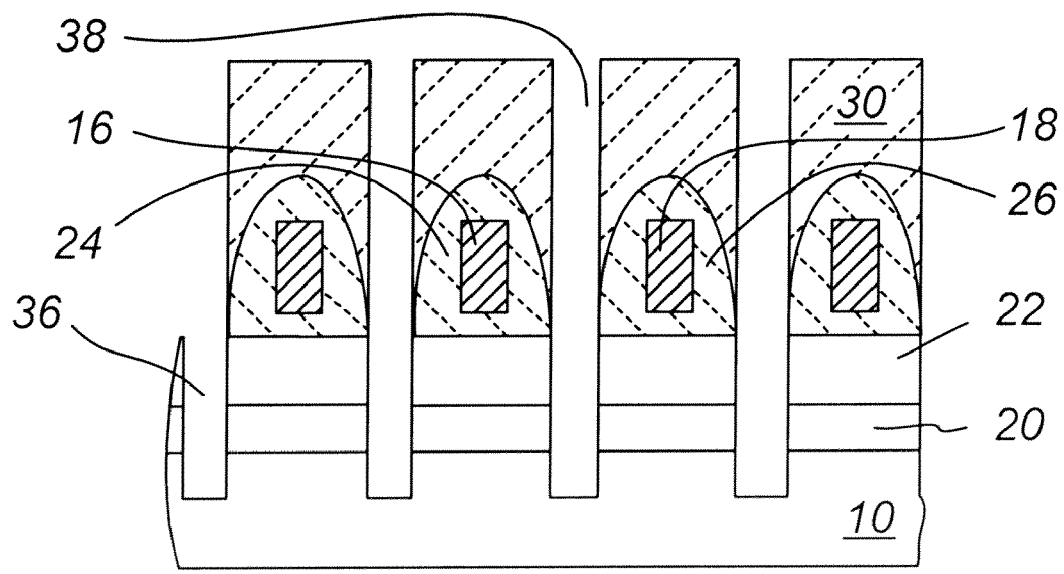

After the contact trenches 32, 34 are etched as shown in FIG. 5, further etching is performed to etch trenches 36, 38 into the substrate as shown in FIG. 6. The substrate etching is performed within the contact openings so that the lateral extent of the substrate trenches 36, 38 is similar to the lateral extent of the contact trenches 34 through the pre-metal dielectric 30. Preferably the trenches 36, 38 extend through the surface layer 22, through the stressor layer 20 and into the substrate underlying the stressor layer. Dry etch chemistries for etching vertically or anisotropically through the substrate and stressor layer are well known and preferably are used to form the illustrated trenches 36, 38. Appropriate etch systems such as reactive ion etching equipment are known to those of ordinary skill. As is described in U.S. Pat. No. 7,338,834, the preferred surface silicon layer 22 and the preferred buried silicon germanium layer 20 may each have thicknesses and compositions selected for a particular device geometry and application. Typically the trenches are etched to a depth of about ten to fifty nanometers, for example.

When the contact trenches 36, 38 are etched into the substrate in the manner described above, the buried stressor layer 20 relaxes and induces strain in the upper layer 22, without further processing. In a preferred embodiment with a buried stressor layer with compressive in-plane stress, some of the compressive in-plane stress is relieved by elastic relaxation at the contact trench edges and tensile strain is induced in the upper layer. In the illustrated embodiment, where the trenches 36, 38 are etched on either side of FETs, the separation between adjacent trenches is generally small enough to allow for edge relaxation to be effective over the entire separation between trenches, providing longitudinal strain in the upper semiconductor layer 22 over the distance between the trenches and extending longitudinally underneath the gate electrodes 16, 18 in surface layer 22. Because the contact trenches 36, 38 into the substrate extend over a substantial portion and preferably the whole extent of the transverse distance between the trenches 12, 14, the upper silicon layer 22 is strained longitudinally over a useful transverse portion of where the channel of the FET can form. The stress distribution in the upper layer will be non-uniform between the trenches. Simulations show that the strain induced in the upper layer may peak anywhere from fifty nanometer (nm) to two hundred nanometers away from the edges of the trench creating the edge relaxation. For a typical one hundred nanometer extent between contact trenches in currently contemplated device geometries, simulations have suggested that the peak of induced strain will most likely be at the midpoint between the trenches. Of course, different geometries for the separation between trenches may show different strain distributions. Here, as in the above discussions, the term edge relaxation has the same meaning as is provided in U.S. Pat. No. 7,338,834.

In the implementations discussed here, it is possible to provide biaxial strain to the active region of a FET using a combination of trench isolation structures and contact trenches extended into the substrate. Such biaxial strain is most advantageous for n-channel FETs. Most preferably for a preferred n-channel FET, stress induced through forming the isolation trenches and stress induced through forming the contact area trenches combine to provide effective biaxial stress in the preferred silicon active layer.

Figure 7:
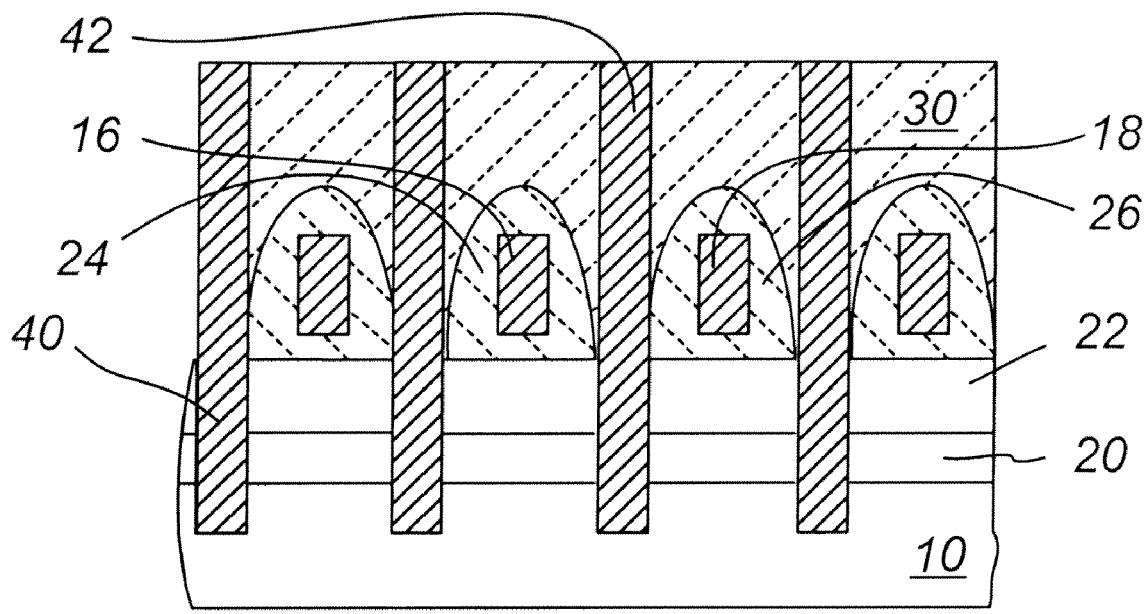

Following the substrate trench etching and edge relaxation as illustrated in FIG. 6, further processing continues to form metal conductors extending to make contact to the source and drain regions of the illustrated FETs, as shown in FIG. 7. The process for forming contacts can be, for example, performed in much the same manner as is described in U.S. patent application publication No. 2009/0166866 to Fastow, et al., "Contact Metallization for Semiconductor Devices." The Fastow publication is incorporated by reference here in its entirety, including for its discussion of etching contact openings and forming metal silicide and metal conductors to the contact regions of FETs.

The contact formation process of FIG. 7 proceeds by cleaning the silicon surface at the bottom of the trenches where the contact will be formed. The process deposits a silicide-forming metal such as titanium, cobalt or nickel on the exposed semiconductor surface which will later react with silicon to form a metal silicide. This deposition is performed by chemical vapor deposition or physical vapor deposition. Further processing deposits a sacrificial metal liner film such as titanium nitride or tungsten nitride to protect the silicide-forming metal from oxidation during annealing. Annealing, typically rapid thermal annealing, is then performed to cause the deposited silicide-forming metal to react with silicon to form a silicide. The process then removes non-reacted silicide-forming metal and the sacrificial metal liner, for example, by a liquid acid etch and clean. Next, a thin conductive layer such as titanium nitride is deposited to improve adhesion between the contact metal and the silicide and the sidewalls of the contact trench. Then a contact metal such as tungsten is deposited using, for example, chemical vapor deposition. This is only one embodiment of course. Other metals such as copper may be used as contact metal, so long as a metal diffusion barrier liner is deposited first. In addition, it is possible to partially fill the substrate portion of the trench with an insulator and to only partially fill the trench with contact metallization.

Following contact formation, the process has provided an array of FETs having biaxial strain in the upper layers of their respective active regions, with the biaxial strain provided efficiently through edge relaxation. The transverse component of strain in the FET channel region is provided by edge relaxation at isolation trenches and the longitudinal component of strain in the FET channel region is provided by edge relaxation at contact trenches. Preferably the formed FETs are n-channel FETs. Further processing is performed to complete the integrated circuit device, forming several levels of metal wiring lines separated by interlayer dielectrics.

Figure 8:
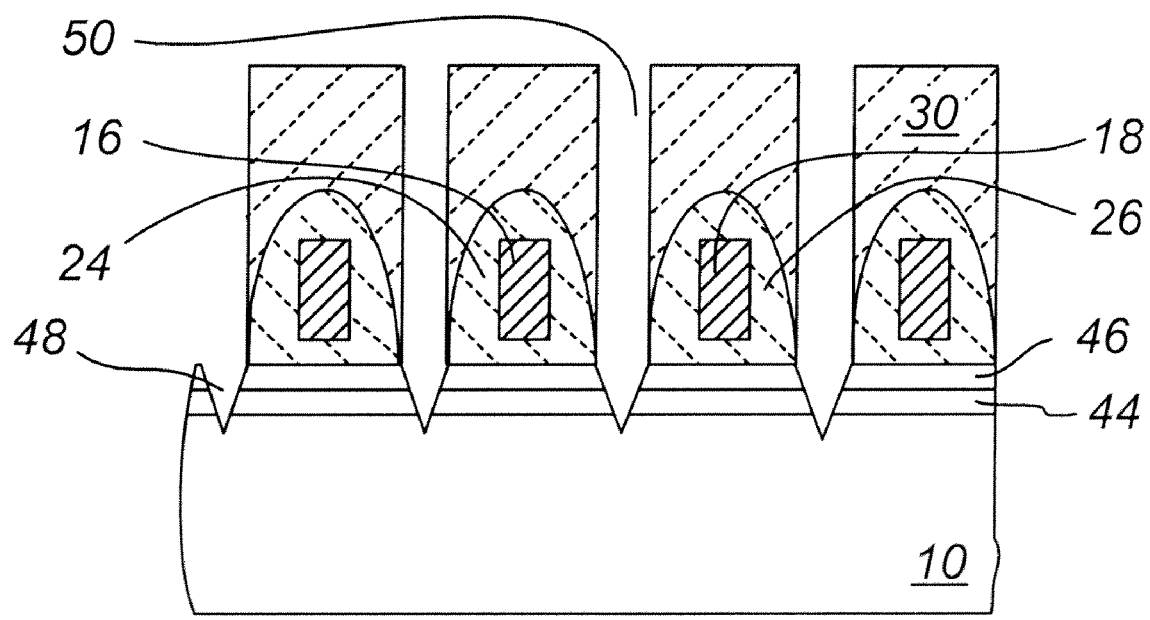
FIGS. 8-9 illustrate an alternative strategy for forming contacts to what is illustrated in FIGS. 6 and 7 according to preferred aspects of the present invention.
Figure 9:
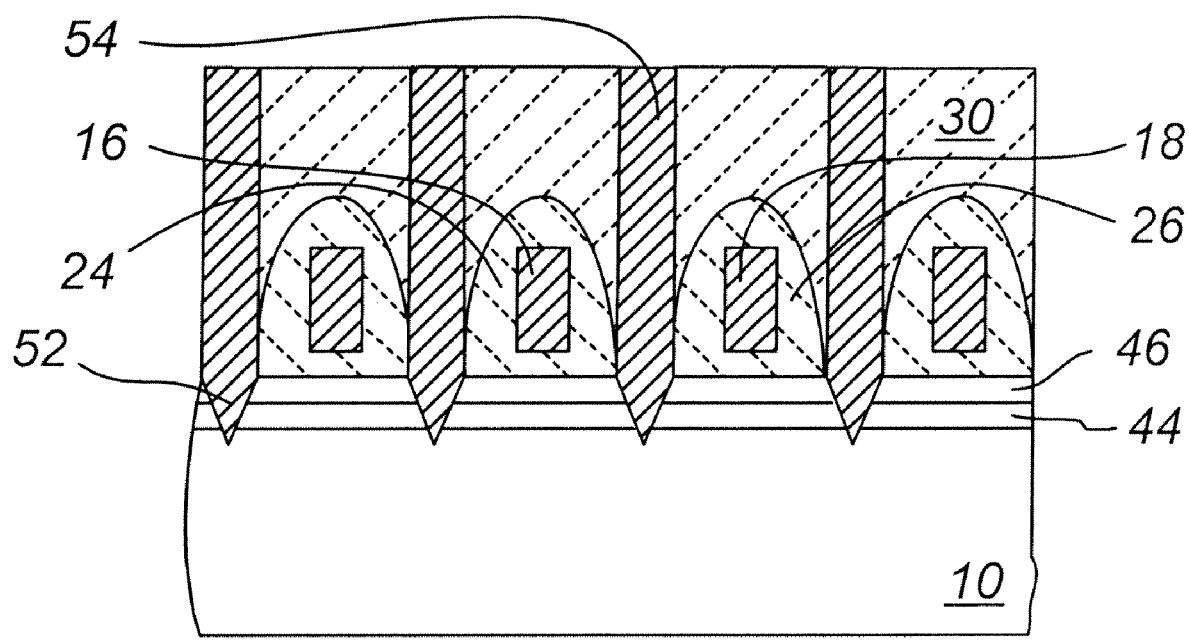

FIGS. 8 and 9 show aspects of an alternate embodiment of aspects of the present invention. This alternate embodiment begins from the mid process stage illustrated in FIG. 5, where contact trenches have been etched to expose the substrate. In the illustration of FIG. 8, layer 44 is the buried stressor layer and is preferably silicon germanium. Layer 46 is the upper, active layer and is preferably silicon. The relative proportions of layers 44 and 46 in the schematic FIGS. 8 and 9 are adopted to make it easier to illustrate aspects of this alternative process but are not intended to suggest a different configuration or process. That is, layer 20 and layer 44 are similar and their compositions can be selected according to different implementations. Examples of appropriate dimensions and compositions for stressor layers 20 and 44 are discussed above. Similarly, upper active layers 22 and 46 are similar and their compositions can be varied considerably. Examples of appropriate dimensions and compositions for surface layer 22 are discussed above.

Rather than using reactive ion or plasma etching to etch trenches into the substrate, the process illustrated in FIG. 8 etches into the substrate using a wet etch. As illustrated in FIG. 8, the substrate contact etch is aligned with the openings in the pre-metal dielectric 30. Advantageously, the illustrated contact etch facilitates larger area contacts 48, 50 that improve the conductivity of contacts to the source and drain regions of the contacts. The wet etch process forms a higher area contact, which is an independent advantage of the wet etch process and can be implemented independently of the edge relaxation and induced stress advantages discussed here. On the other hand, the illustrated wet etch process preferably and advantageously is implemented as part of the edge relaxation process. Thus, when the contact trenches of FIG. 8 are etched through the surface layer 46 and the buried stressor layer 44 and into the underlying substrate, stress is relaxed in the layer 44 and induced in the overlying layer 46 in the manner discussed above with respect to the FIG. 7.

The wet etch of FIG. 8 preferably is done using an orientation-selective wet etch and a {100} oriented surface of a silicon wafer. An advantage of this method is that the pyramidal contact holes have a self-limiting depth in silicon equal to 70.7% of the width of the contact opening due to the fixed 54.74° angle between {111} lattice planes and {100} lattice planes. Such an orientation selective etch forms a four-sided, inwardly sloping contact hole in the silicon with the four sides corresponding to {111} crystal faces. Suitable wet etch solutions include: tetramethylammonium hydroxide (TMAH) solution; potassium hydroxide (KOH) solution; sodium hydroxide (NaOH) solution; ammonium hydroxide ($NH_4OH$) solution in water; a solution consisting at least in part of ethylenediamine (1,2-diaminoethane hydrate) $NH_2(CH_2.CH_2)NH_2$ and pyrocatechol (o-dihydroxybenzene) $C_6H_4(OH)_2$; or a solution of hydrazine in water.

Following the contact opening etch, and whether or not the contact etch is combined with the edge relaxation process, metal contacts are formed within the contact openings to make contact to the source or drain contact regions of the FETs. This can be, for example, accomplished in the way discussed above with respect to FIG. 7. Following contact formation, the process has provided an array of FETs having biaxial strain or even only uniaxial longitudinal strain in the upper surface layers of their respective active regions, with the strain provided efficiently through edge relaxation. Preferably the formed FETs are n-channel FETs. Further processing is performed to complete the integrated circuit device, forming several levels of metal wiring lines separated by interlayer dielectrics.

As discussed above, different materials can be selected as stressor layers. In addition to silicon germanium, primarily discussed above, silicon nitride or silicon oxynitride deposited with a built-in stress can be provided as a stressor layer. Providing silicon nitride or silicon oxynitride as a stressor layer may have important advantages in manufacturing over silicon germanium, for example where it is desired to have field effect transistors formed in silicon-on-insulator (SOI) wafers. Using silicon nitride as a buried stressor layer provides additional flexibility because silicon nitride can be deposited in either a compressive or tensile stressed state and can therefore be used to induce either tensile or compressive stress in an overlying silicon surface layer through edge relaxation of the silicon nitride layer. A silicon nitride buried stressor layer may be provided by wafer bonding techniques. For example, various methods for forming a buried stressed silicon nitride or silicon oxynitride layer by wafer bonding are described in U.S. Pat. No. 6,707,106 to Wristers, et al., which is incorporated by reference here for these and its other teachings. The stressed silicon nitride layer may have a silicon oxide layer on one or both of its upper and lower faces. If a silicon oxide layer intervenes between the stressed silicon nitride and the top semiconductor active layer, the silicon oxide-semiconductor interface may have superior electrical properties in comparison with a silicon nitride-silicon interface. On the other hand, the stress induced in the top semiconductor layer by edge relaxation may be less if the intervening silicon oxide layer acts as a stress buffer due to its inherent mechanical compliance. Therefore in some circumstances it may be preferred to have the buried silicon nitride layer in direct contact with the top semiconductor active layer.

A preferred method for fabricating a buried silicon nitride layer in direct contact with a top semiconductor active layer follows. In an exemplary process, a high quality silicon nitride thin film may first be formed on the surface of a donor silicon wafer by thermal nitridation, for example using a plasma source of free nitrogen atoms or a molecular nitrogen source such as ammonia ($NH_3$) and heating to a high temperature in the range 300° C. to 1050° C. and then a stressed silicon nitride or oxynitride layer may be subsequently deposited, followed by deposition of a thin film of silicon oxide. The purpose of a high quality nitride thin film is to provide a suitably high quality interface with low interface defect and trap densities between the silicon nitride and the silicon which is a desirable condition for good performance and reliability of MOS transistors subsequently fabricated in close proximity to the interface. The layered silicon—silicon nitride—silicon oxide wafer so formed may then be bonded to a silicon handle wafer using a standard method for wafer bonding involving a combination of applied pressure and thermal annealing as widely practiced in the semiconductor industry and described in the above-incorporated Wristers patent. The silicon handle wafer may optionally have a silicon oxide layer formed upon it before the wafer bonding is performed to facilitate or improve the bonding process. Subsequently the donor wafer may be removed by a standard wafer separation process, such as the Smart Cut™ process employed by SOITEC Silicon On Insulator Technologies, a company of Bernin, France, leaving a thin layer of silicon of desired thickness attached to the silicon nitride layers. The stressed silicon nitride layer may be deposited, for example by plasma enhanced chemical vapor deposition (PECVD). By varying input factors in the PECVD process, predictable amounts of either tensile or compressive built-in stress in the range 1.7 GPa tensile to 3.0 GPa compressive can be selectively incorporated in a deposited silicon nitride thin film. Subsequent processing may include forming trench isolation structures and further process steps such as those illustrated above in FIGS. 1-7.

In another embodiment, the buried stressor layer and the surface silicon active layer can be formed later in the course of processing. In particular, the workpiece or wafer may be a conventional silicon or SOI wafer that is processed in the conventional manner through the patterning of trenches for trench isolation structures. The trenches may than be filled with an insulator that is either somewhat compliant or that can be removed. Preferred implementations of this aspect then proceed to selectively deposit first a buried stressor layer and then a surface silicon layer as desired on the wafer. In one implementation, both the buried stressor layer and the surface silicon layer could be deposited only on portions of the substrate where biaxial stress is preferred in the surface silicon layer. For example, the selective deposition might deposit buried stressor material and surface silicon only on those regions where n-channel FETs are to be formed. This process of selective deposition can be achieved, for example, if the trench isolation structures are filled with an appropriate material such as silicon oxide and the other portions of the wafer that are to not receive the stressor layer are covered with a masking layer of silicon oxide. Then silicon germanium (as a buried stressor layer) followed by silicon (as a surface active layer) are selectively deposited on the exposed silicon surfaces of the substrate using well known selective deposition processes. The masking silicon oxide can then be removed and the wafer subjected to further processing to form devices including FETs. The contact edge relaxation processes illustrated in FIGS. 1-9 can be practiced on those portions of the substrate in which a buried stressor layer and a surface silicon layer are formed. The contact formation processes illustrated in FIGS. 8-9 can be practiced over the entirety of the resulting wafer, as desired.

Alternately, this embodiment may selectively deposit the buried stressor material on those locations where biaxial stress is preferred for the surface silicon layer and deposit the surface silicon layer over all of the active regions on the substrate. This process is like that described in the previous paragraph through the selective deposition of the buried stressor layer. After that process, the masking silicon oxide would be removed and then silicon would be selectively deposited on the exposed silicon and buried stressor layer surfaces. Processing continues on the different portions of the wafer as set out in the earlier discussion.

In still another variation, both a buried stressor layer and a surface silicon layer can be selectively deposited on all of the active regions of the device. Most preferably, the buried stressor layer and the surface silicon layer are not deposited on the portions of the wafer where trench isolation structures are present, because the trench isolation structures have on their surfaces an appropriate material such as the silicon oxide used to fill the trenches. Following the selective deposition, processing continues as discussed above.

For all of these selective deposition embodiments, the buried stressor layer and the surface layer can have the characteristics and properties (such as thickness and composition) discussed above or in the discussions in U.S. Pat. No. 7,338,834, For example, appropriate thickness (i.e., below critical thickness) layers of silicon germanium can be selectively deposited as a buried stressor layer and an appropriate thickness of silicon can be selectively deposited as an active layer.

When an appropriate buried stressor layer and an appropriate surface layer are selectively deposited on an appropriate size region of a wafer, the buried stressor layer may induce stress in an overlying silicon surface layer across the extent of one (uniaxial) or two (biaxial) lateral extents. Here, an appropriate size region of a wafer refers to a lateral dimension of the region. For a sufficiently small lateral dimension along one axis, the buried stressor layer can induce strain across the extent of the overlying silicon surface active layer along that axis. For sufficiently small lateral dimensions along two axes, the buried stressor layer can induce biaxial stress across the lateral extent of the surface silicon active layer along the two axes. For these small lateral dimensions, the buried stressor layer and the surface layer are in an equilibrium stress state as they are grown and so the surface layer is desirably stressed in its grown state, so long as the layer is sufficiently thin as to not relax its surface though a plastic deformation mechanism such as generation of misfit dislocations. The dimensions appropriate for the substrate region on which to selectively deposit the buried stressor layer and the surface active layer are the same as those identified for trench separations in U.S. Pat. No. 7,338,834. When bilateral strain within a surface active layer is accomplished using selective deposition on an appropriately sized region of the substrate, the lateral extent of the region of the substrate is defined by surrounding trenches of trench isolation structures. In essence, this selective deposition process produces the same results structurally and functionally as illustrated and discussed in U.S. Pat. No. 7,338,834.

When this selective deposition process is used to provide a strip of active silicon like that illustrated in FIGS. 1 and 2, the trenches 12, 14 are preferably spaced sufficiently closely to achieve buried stressor relaxation and surface layer stress over the lateral extent between the trenches. At this stage of processing, the surface active layer has been subjected to uniaxial stress. In some implementations that may be the only stress applied. Further processing such as annealing of the trench fill material or replacement of the trench fill material could then be performed to provide a desirably rigid trench insulation material for further processing. After appropriately rigid trench insulation material is provided, the processes described above with respect to FIGS. 1-9 may be performed as desired to provide edge relaxation along a second axis so as to provide biaxial stress to the surface layer.

For the selective deposition implementations described above, the isolation trenches are desirably filled with an appropriate material to facilitate selective deposition. This material desirably is also sufficiently compliant to allow the relaxation of the stressor material and the surface layer during growth. If the material is not sufficiently compliant, it may be necessary to remove the material to efficiently induce stress in the surface layer. Generally it is desirable to grow or deposit a dense silicon oxide or silicon nitride liner layer on the walls of the trench and to then fill the trench with additional appropriate material. One preferred compliant material for filling the isolation trenches is silicon oxide deposited by chemical vapor deposition from a tetra ethyl ortho-silicate (TEOS) vapor source. Generally this material is sufficiently compliant to allow for desired induced strain within the surface layer. After the selective deposition processes, the TEOS silicon dioxide is subsequently densified by thermal annealing according to standard procedures well known in the industry. Annealed TEOS trench fill generally gives rise to additional tensile strain in the system which is applied laterally to the active layer or silicon surface layer. Whether or not the TEOS or other material is sufficiently compliant to allow stress to be induced in the surface layer, it is possible to remove the initial trench fill material and replace that material with conventional trench isolation fill materials.

Following the selective deposition processes and trench fill processes described above, further processing as illustrated in FIGS. 1-9 or as illustrated in U.S. Pat. No. 7,338,834 can be performed as desired to produce FETs having uniaxially or biaxially strained surface layers such as uniaxially or biaxially strain silicon active layers. Certain preferred embodiments provide n-channel FETs having biaxially strained silicon active layers.

Preferred processes including those described above can select and to some extent control the relative amounts of stress directed along each of the primary axes of a semiconductor device, for example, corresponding to the width axis and length axis of a FET. The amount of stress directed along the transverse axis may be determined by the spacing of the isolation trenches which is in turn determined by the layout of the mask used to define the active area of the devices. The amount of stress applied along the longitudinal direction is determined primarily by the positioning of the contact trenches, which is driven by design rule and lithographic considerations as well as stress engineering considerations. Generally the spacing under these configurations is sufficiently small to allow for effective edge relaxation and induced stress from the silicon germanium or other stressor layer to the silicon or other active layer. Where in-plane strain is not desired in the upper semiconductor layer along the transverse axis in a semiconductor device, the isolation trenches preferably are spaced sufficiently far apart along that axis such that the effect of the edge relaxation mechanism is suitably minimized. Conversely, where in-plane stress is desired in the semiconductor along a particular axis in a semiconductor surface portion, the trenches preferably are spaced sufficiently close together along that axis so the effect of the edge relaxation mechanism is suitably maximized. Where longitudinal tensile strain is not desired along the longitudinal axis in the upper semiconductor layer of a semiconductor device, for example in p-channel FETs, the contact trenches are preferably not etched into the buried layer so the effect of the edge relaxation mechanism proximate to the channel is avoided.

In-plane tensile strain can be created in active regions of a thin layer of semiconductor by having an in-plane compressive stress in a buried compressive stressor layer and etching closely-spaced trenches through both layers and into the substrate below the buried stressor layer. The trenches preferably are etched deep enough to ensure that the buried stressor layer is able to relax laterally by elastic edge relaxation across a lateral extent of the stressor layer between the trenches, preferably corresponding to the lateral extent of the overlying active semiconductor layer. Consequently the compressive stress is reduced in the buried stressor layer in proximity to the isolation trenches and tensile strain is induced in the overlying semiconductor active layer in proximity to the isolation trenches. This is readily achieved with appropriate stresses and geometry according to the present invention.

The strain induced into the upper semiconductor layer by this method may in general be non-uniform in its distribution but is of sufficient magnitude to improve the in-plane electron and hole mobilities to a desirable extent and hence to improve the electrical performance of MOS transistors having channels at least in part formed in the layer. As such, the method permits the fabrication of strained bulk MOS devices and strained MOS SOI devices with potentially low cost and low defect counts compared to conventional methods.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

What is claimed is:

1. A method of manufacturing a semiconductor device, comprising:
    providing a substrate having a semiconductor surface layer, the substrate having a stressor layer positioned at a depth within the substrate and positioned adjacent the semiconductor surface layer, the buried stressor layer provided in a stressed state in comparison to the semiconductor surface layer;
    forming a field effect transistor on the semiconductor surface layer, the field effect transistor comprising source and drain regions and a gate structure;
    forming a pre-metal dielectric layer over the field effect transistor;
    etching openings in the pre-metal dielectric layer and etching to expose contact portions of the substrate on either side of the gate structure;
    etching into the substrate within the openings in the pre-metal dielectric, the etching proceeding to sufficient depth so that the stressor layer induces stress in the semiconductor surface layer to provide longitudinal stress to the upper semiconductor layer in a channel region of the field effect transistor through edge relaxation; and
    forming electrical contacts to the source and drain regions with the contacts formed at least partially within the substrate.

2. The method of claim 1, wherein the etching into the substrate extends through the stressor layer and into the substrate below the stressor layer.

3. The method of claim 1, wherein the etching into the substrate is performed through an orientation-selective wet etch.

4. The method of claim 1, wherein the etching is performed through an anisotropic etch.

5. The method of claim 1, wherein the semiconductor surface region is silicon and the stressor layer is silicon germanium alloy.

6. The method of claim 1, wherein the buried stressor layer is a layer of silicon nitride in a state of compressive built-in stress.

7. The method of claim 1, wherein the buried stressor layer is a layer of silicon nitride in a state of tensile built-in stress.

8. The method of claim 1, wherein the buried stressor layer is selectively deposited on a portion of a surface following definition of trenches for trench isolation structures.

9. The method of claim 1, wherein the buried stressor layer and the semiconductor surface layer are selectively deposited on a portion of a surface following definition of trenches for trench isolation structures.

10. The method of claim 9, wherein the semiconductor surface region is silicon and the stressor layer is silicon germanium alloy.

11. The method of claim 1, wherein the field effect transistor is an n-channel field effect transistor.

12. The method of claim 11, wherein the channel region is silicon.

13. The method of claim 1, wherein the stressed state of the stressor layer is in-plane compressive stress and the longitudinal stress of the surface semiconductor region is tensile stress.

14. The method of claim 12, wherein the field effect transistor is an n-channel field effect transistor.

15. The method of claim 13, wherein the channel region is silicon.

* * * * *